United States Patent [19]
Ravazzini

[11] Patent Number: 5,986,936
[45] Date of Patent: Nov. 16, 1999

[54] CIRCUIT FOR THE GENERATION OF A HIGH VOLTAGE FOR THE PROGRAMMING OR ERASURE OF A MEMORY

[75] Inventor: Roberto Ravazzini, Aix en Provence, France

[73] Assignee: STMicroelectronics S.A., Gentilly, France

[21] Appl. No.: 09/150,954

[22] Filed: Sep. 10, 1998

[30] Foreign Application Priority Data

Sep. 10, 1997 [FR] France .................................... 97 11218

[51] Int. Cl.$^6$ .................................................. G11C 16/04
[52] U.S. Cl. ............................... 365/185.19; 365/189.09; 365/226
[58] Field of Search ............................ 365/189.09, 226, 365/185.28, 185.29, 185.19; 327/535, 537, 538, 540

[56] References Cited

U.S. PATENT DOCUMENTS

| | | | |
|---|---|---|---|
| 4,488,060 | 12/1984 | Simko ...................................... | 307/263 |
| 5,014,097 | 5/1991 | Kazerounian et al. ................... | 257/317 |
| 5,408,133 | 4/1995 | Honnigford et al. ..................... | 327/134 |
| 5,446,697 | 8/1995 | Yoo et al. ................................. | 365/226 |
| 5,642,309 | 6/1997 | Kim et al. ............................ | 365/185.22 |
| 5,835,420 | 11/1998 | Lee et al. ............................ | 365/189.09 |

OTHER PUBLICATIONS

Carney et al., "Configurable EEPROMS for ASICS", Proceedings of the IEEE 1988 Custom Integrated Circuits Conference, New York—May 16, 1988, pp. 4.21–4.24.

Lucero et al., "A 16 kibt Smart 5V–only EEPROM with Reduncancy", IEEE Journal of Solid–State Circuits, vol. 18, No. 4, Oct. 1983, New York—pp. 539–544.

French Search Report (Jun. 2, 1998).

*Primary Examiner*—Son Mai
*Attorney, Agent, or Firm*—Gunster, Yoakley, Valdes- Fauli & Stewart, P.A.

[57] ABSTRACT

A circuit for the generation of a high ramp voltage for the supply of voltage to a capacitive load, in particular a high voltage for the programming or erasure of at least one memory cell of a non-volatile memory, comprises floating-gate transistors as storage elements. This generation circuit comprises a P type load transistor connected by its source to the output of a voltage booster delivering a high direct and constant voltage (HIV), by its drain to the load, the high ramp voltage being available at this drain, and by its control gate to a control feedback circuit to control the load current. This circuit achieves automatic control over the slope of the high ramp voltage (Vpp). Application to the generation of a high ramp voltage whose slope is smaller than a critical slope and the maximum value is high.

7 Claims, 3 Drawing Sheets

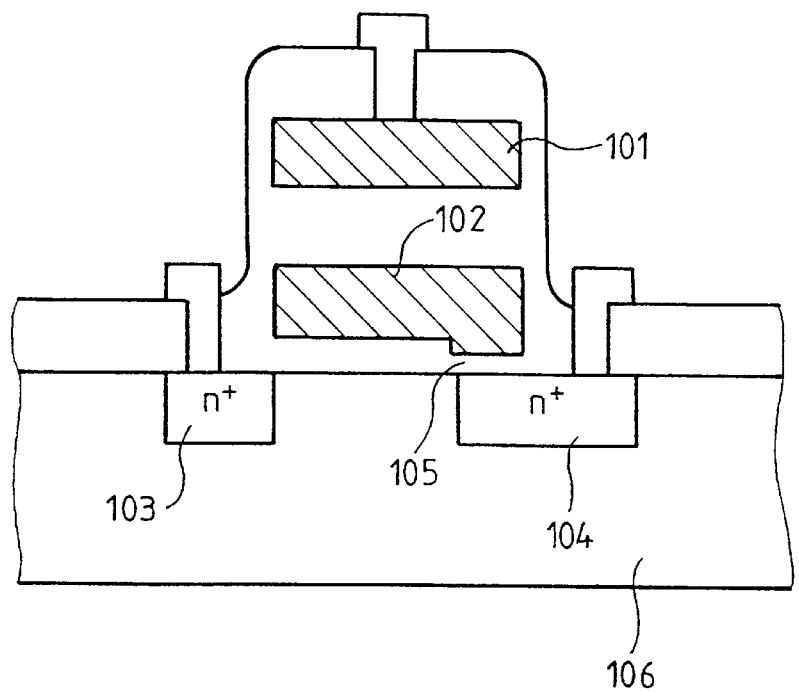
FIG_1
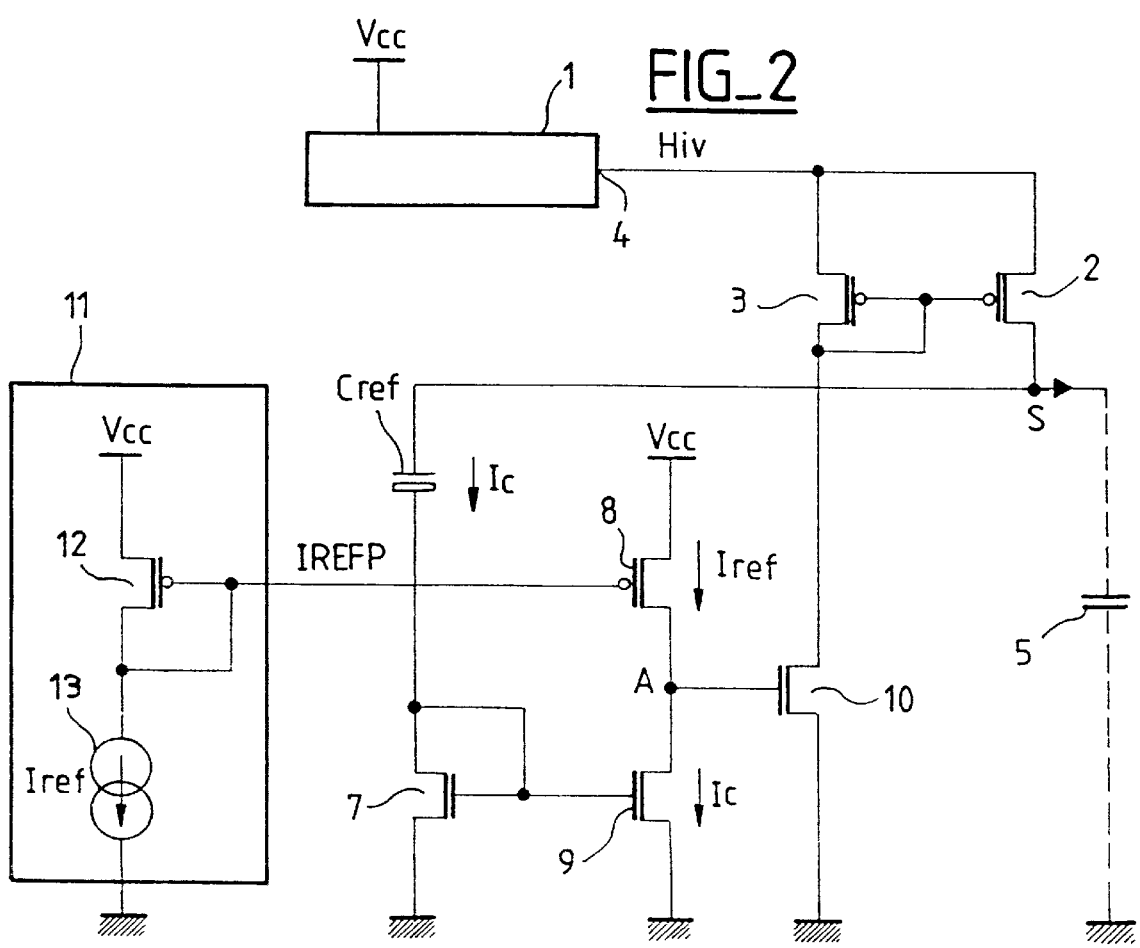
FIG_2

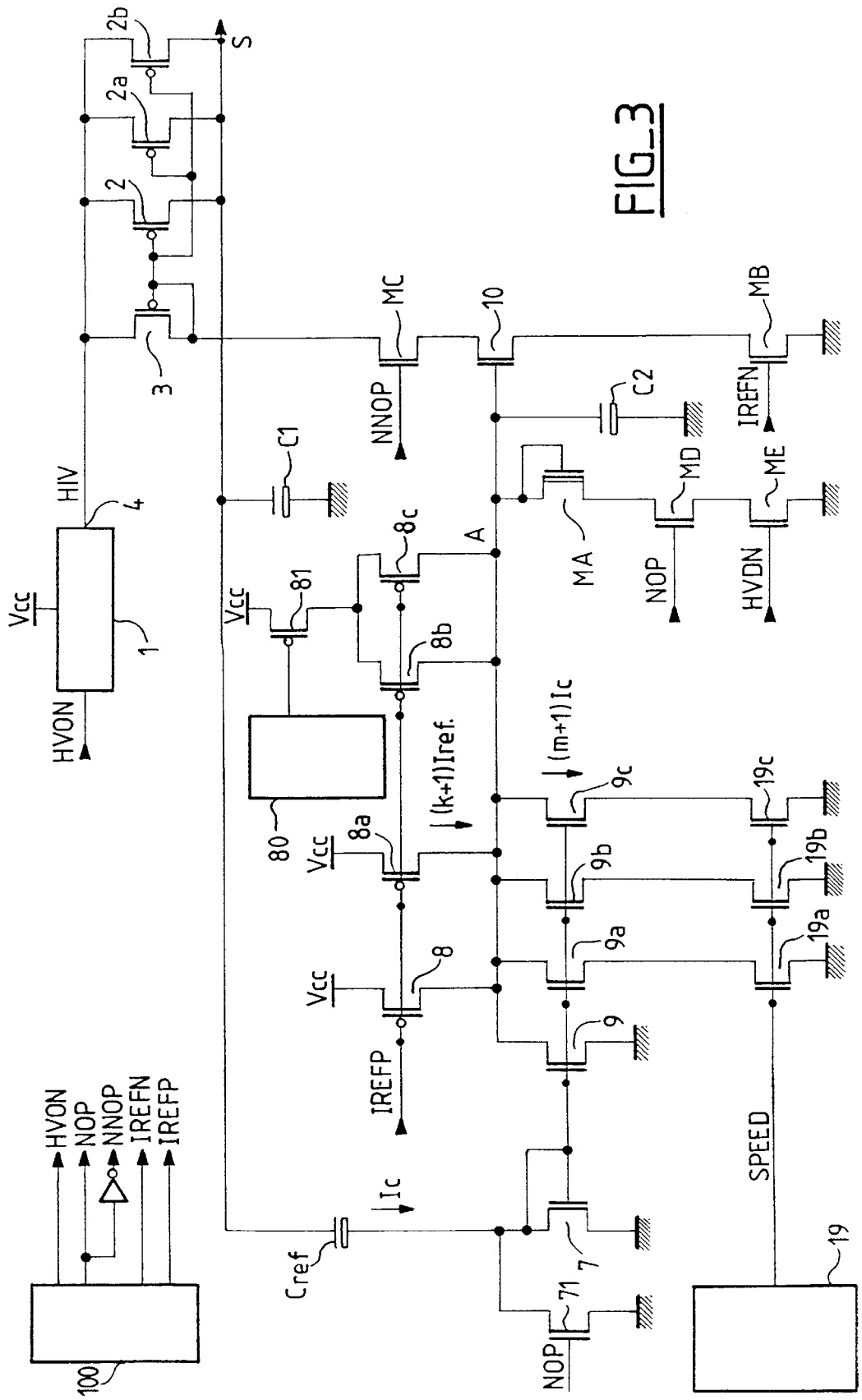
FIG_3

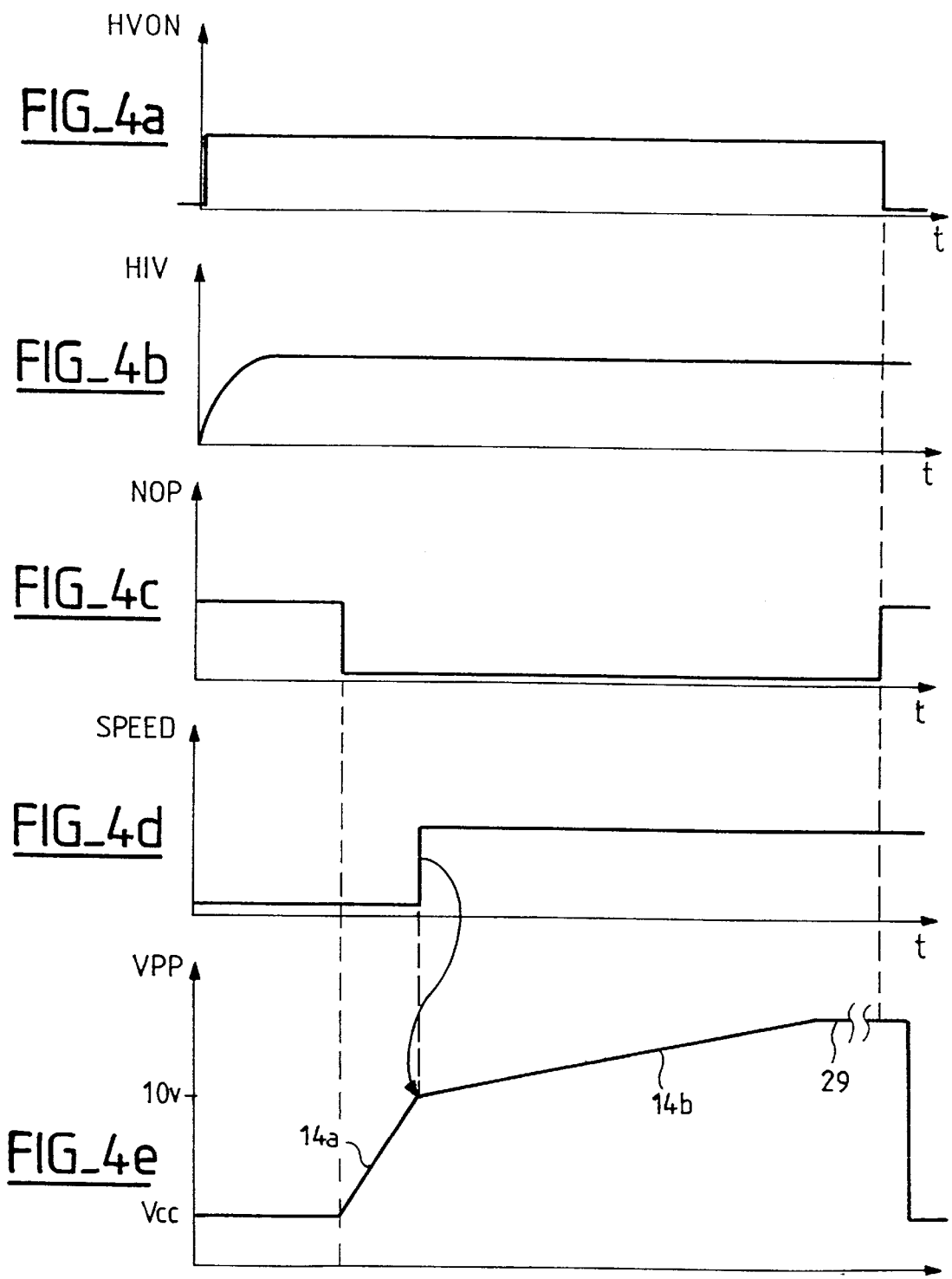

CIRCUIT FOR THE GENERATION OF A HIGH VOLTAGE FOR THE PROGRAMMING OR ERASURE OF A MEMORY

CROSS-REFERENCE TO RELATED APPLICATIONS

This application is based upon and claims the benefit of priority of the prior French Patent Application No. 9711218 filed Sep. 10, 1997, the contents of which are hereby incorporated by reference.

BACKGROUND OF THE INVENTION

1. Field of the Invention

The invention relates generally to the field of semiconductor memories and more specifically to non-volatile electrically erasable and/or programmable memories (EPROMs, EEPROMs or Flash memories), and to a program for the generation of a high ramp voltage for the supply of a load, especially a high voltage for the programming or erasure of at least one memory cell. It can be applied especially to.

2. Discussion of Related Art

A memory cell of an EEPROM consists of a floating-gate transistor (FIG. 1) comprising a control gate 101, a floating gate 102, a source region 103, a drain region 104, an oxide layer 105 and a substrate region 106. The gate 102 is the storage element, it is said to be floating because it has no contact with the exterior imposing a potential on it. The control gate 101 is connected to a word line of the memory and the drain region 104 is connected to a bit line of the memory. The structure shown in FIG. 1 shows that the oxide thickness 105 between the floating gate 102 and the substrate region 106 is very small. Typically, it is in the range of some nanometers. The small oxide thickness enables electrons to pass at this place by tunnel effect.

For the programming or erasure of a memory cell of this kind, it is necessary to produce high voltages of the order of 15 to 20 volts. The terms "high voltage" or "strong voltage" are used hereinafter to designate a voltage, in the range of 15 to 20 volts, that is high as compared with the general supply voltage of the circuit which is in the range of 3 to 5 volts and which may even be lower, for example 1.8 volts.

To program a memory cell, a positive high voltage is applied to the bit line of the memory, connected to the control gate 101 of the memory cell, and a zero voltage is applied to the bit line connected to the drain region 104. The application of these voltages creates a high electrical field through the narrow oxide layer 105. The result of this is the migration of electrons to the floating gate 102 by tunnel effect. These electrons are then trapped in the floating gate 102.

Conversely, to erase the memory cell, a high positive voltage is applied to the bit line and a zero voltage is applied to the word line. The migration of the electrons then takes place in the reverse direction and the floating gate 102 gets discharged. Thus, the high programming or erasure voltage is transmitted to a programming input of the memory array which behaves like a load that is essentially capacitive owing to the parasitic capacitances of the floating-gate transistors that form it.

The high programming or erasure voltage may be produced by supply means external to the integrated circuit incorporating the memory. However, when the integrated circuit for which a high programming voltage has to be produced is a mounted circuit, in particular when it is a chip of a chip card, the high programming voltage must be produced within the integrated circuit itself from its general supply voltage. There is a known way of using a low general supply voltage, for example of 5 volts, to produce high internal voltages, for example in the range of 20 volts.

The development of technologies however is leading to recommendations for the use of general supply voltages with lower values, for example voltages of 3 volts, or even 1.8 volts. The usefulness of these very low voltage solutions is that the total energy dissipated in an integrated circuit is reduced. Its temperature is therefore lower, and it works all the more efficiently. Furthermore, with the miniaturizing of the circuits, the breakdown voltages or the voltages corresponding to changes in state are reduced so that a low voltage supply becomes a necessity. However, despite this miniaturization, it is still necessary to have recourse to high programming voltages.

The principle of the production of a high voltage within an integrated circuit consists of the use of a voltage booster circuit within this integrated circuit. A voltage booster circuit comprises, for example, a SCHENKEL type multiplier or else, more conventionally, a load pump. The technique of the manufacture of these booster circuits is such that, for a given supply voltage equal for example to 5 volts, the value of the high voltage produced is limited to a maximum, for example 20 volts. If the supply voltage is lower, for example, 3 volts, it becomes impossible to produce potential differences above 18 volts, for example by producing positive voltages and negative voltages in the circuit. It will be understood that, owing to this technological development, it is becoming increasingly difficult to generate programming or erasure voltages with a value that is high enough to enable their function to be fulfilled. This is all the truer if the supply voltage is below 3 volts.

Furthermore, the greater the value of the high voltage produced as compared with the initial general supply voltage, the lower is the fan-out of the voltage booster, especially when this booster is a load pump.

It is known that the fan-out of the booster, among other things, determines the performance characteristics of the circuit in terms of the number of memory cells that can be programmed or erased at the same time, and in terms of speed. It is therefore necessary to achieve a compromise between, firstly, the value of the high voltage delivered by the booster circuit and, secondly, the fan-out of said circuit. Be that as it may, any drop in voltage allowed between the output of the booster circuit and the programming or erasure input of the memory array causes a limitation of the performance characteristics of the circuit. Indeed, to maintain a sufficient value of the high programming or erasure voltage, it is necessary to compensate for this drop in voltage by a voltage that is all the higher at output of the booster circuit, which therefore reduces its fan-out.

Furthermore, during the transfer of electrons between the floating gate 102 and the drain region 104 of the memory cell, it is indispensable that the variation of the electrical field created between the two zones should not be very sudden so as not to embrittle or even damage the oxide layer 105.

Consequently, a circuit is generally used for the generation of a high ramp voltage enabling a linear increase in the voltage applied to the control (programming) gate 101 or to the drain (erasure) region 104 of the memory cell. The slope of the ramp must be kept below a critical value above which the oxide layer of the floating-gate transistors would be damaged.

It is an object of the present invention is to propose a circuit for the generation of a high ramp voltage whose slope is well controlled and whose maximum value, (at the end of the ramp) is high enough while at the same time having good performance characteristics.

It is possible first of all to think of making the voltage delivered by the booster circuit itself vary linearly and in an increasing manner, for example by routing a large but decreasing quantity of the output current of the load pump towards the ground. In this way, the voltage at output of the booster circuit is prevented from reaching its nominal value (which determines the maximum value of the ramp) far too quickly, and it is thus possible to control the rise in voltage at output of the booster circuit in order to keep the slope of this voltage below the critical value. The output of the booster circuit may then be connected directly to the programming or erasure input of the memory array, so that no drop in voltage will be introduced between these two circuit points. The maximum end-of-ramp voltage may reach the nominal value of the high voltage delivered by the booster circuit. An approach of this kind nevertheless has a twofold drawback. Firstly, the load pump constituting the booster circuit delivers high current until its nominal output voltage has been built up, for it then has very low impedance. And forcing its output to remains below this nominal voltage therefore requires the routing of a high current towards the ground, which is done with a total loss. This is particularly detrimental in applications where the general supply is provided by a power source with limited load, such as a cell or a battery. Furthermore, the working of the load pump during the build-up of its nominal output voltage is a cause of disturbance, especially electromagnetic disturbance, likely to damage the efficiency of the memory. An approach of this kind is therefore not satisfactory.

It is therefore preferred according to the invention to design a circuit for the generation of a high ramp voltage of the type in which the high ramp voltage is generated from a high direct voltage with a constant value delivered by a booster circuit. The high ramp voltage is available at output of this generation circuit (and not directly at output of the booster circuit) which is connected to the place of application of the voltage ramp (i.e. to the programming or erasure input of the memory array).

There are known circuits of this kind in which an N type transistor is connected by its drain to the output of a booster circuit delivering a high direct voltage with a constant value and, by its source, to the load formed by the programming or erasure input of the memory array. To the gate of this N type transistor, there is applied a voltage that increases regularly with time so as to control the voltage available at the source. It can then be seen that, except for an intrinsic drop in voltage VTN, this voltage available at the source follows the value of the voltage applied to the control gate of this N type transistor. The load, connected to the source of the N type transistor, is therefore supplied with voltage.

In the prior art, an N type transistor of this kind connected as a load transistor is always used when, as is the case here, a high load current is likely to be delivered into the load. Indeed, all things being equal, the drain current of an N type transistor is higher than that of a P type transistor (because of a greater mobility of the load carrier).

However, the intrinsic voltage drop caused in the N type transistor is generally equal to 2 volts. This leads to a situation where it is no longer possible to have anything but a maximum end-of-ramp voltage of 16 volts with a constant high direct voltage, delivered by the voltage booster circuit, that is equal to 18 volts. If a voltage of over 16 volts is desired, the value of the high voltage delivered by the booster circuit must be increased to the detriment of the fan-out of the load pump, as stated here above.

In the application of the invention to the generation of a high voltage for the programming or erasure of a memory, the capacitive load is formed solely by all the connection nodes, the bit lines or the word lines, of the memory array.

Assuming that the value of the capacitive load is constant, it is enough to maintain a constant delivery of current to the P type load transistor so that the voltage at its drain is a voltage in a rising linear ramp with a constant slope determined by the ratio between the load current and the (constant) value of the capacitive load. For a specified programming or erasure operation, the value of the capacitive load may effectively be kept constant during the operation. However, in reality, it cannot be considered to be constant from one operation to another. Indeed, when the operation is, for example, a refresh programming operation, this value will depend on the initial state of the memory cell to be programmed. When it is an erasure operation, it will depend on the number of memory cells to be erased (for it is possible to erase only one cell, a group of cells or all the cells of the memory array).

SUMMARY OF THE INVENTION

Briefly, according to the invention, the above problem is overcome in a completely different way from the relevant art. Indeed, instead of controlling the voltage available at the source of an N type transistor, the control the delivery of the current flowing through a P type load transistor that is connected by its source to the output of the voltage booster and by its drain to the load. The load connected to the drain of the P type transistor is therefore supplied with current.

According to the invention, there is provided a control loop circuit or control feedback circuit for the control of the current flowing through the P type load transistor which set up an automatic control of the load current and, therefore, since the load is capacitive in nature, an automatic control of the slope of the high ramp voltage available at the drain of this transistor.

BRIEF DESCRIPTION OF THE DRAWINGS

FIG. 1, which has already been analyzed, provides a schematic view of a floating-gate transistor constituting a storage element of the memory.

FIG. 2 is a schematic drawing of the circuit according to the invention.

FIG. 3 is a detailed drawing of a possible embodiment of the circuit according to the invention.

FIGS. 4a to 4e are timing diagrams of signals and voltages of the circuit of FIG. 3.

DETAILED DESCRIPTION OF AN EMBODIMENT

By convention, in the Figures, the P type MOS (metal oxide semiconductor) technology transistors are distinguished from the N type MOS transistors in that they shown with a little circle on their control gate.

In FIG. 2, the voltage booster circuit 1 delivers a high direct voltage HIV of constant value at its output 4, from a general supply voltage Vcc. The general supply voltage has, for example, the value of 3 volts. The high direct voltage has for example a value of 18 volts. The voltage booster circuit 1 preferably has a load pump. In order that the high voltage HIV delivered by the booster circuit may be substantially independent of the current delivered at output, this booster circuit also has a regulation circuit that determines the nominal value of the voltage HIV as is well known to those skilled in the art. The booster circuit works independently and is therefore not disturbed by the rest of the generation circuit.

Furthermore, since the source/drain voltage of a P type transistor is practically zero, the maximum value of the end-of-ramp high voltage is substantially equal to the high direct voltage of constant value that is delivered by the booster circuit. This booster circuit therefore has a reasonable fan-out with respect to requirements, and the generation circuit has good performance characteristics.

A circuit according to the invention sets up an automatic control of the slope of the high ramp voltage which is the control voltage of the load. Thus, whatever the value of the capacitive load, the slope of the high ramp voltage available at the drain of the P type transistor is perfectly controlled. More specifically, since the capacitive load is preferably formed by a memory array of a memory to be programmed or erased, this automatic control enables the slope of the high programming or erasure voltage to be maintained above a critical value, preventing the deterioration of the thin oxide layer of the floating-gate transistor.

According to the invention, the output 4 of the booster circuit 1 is taken at the source of a P type load transistor 2. The drain of the load transistor 2 therefore forms the output S of the circuit of the invention. The drain of this transistor is connected to the place at which the high ramp voltage is applied. In the application considered, it will be the programming or erasure input of an electrically programmable non-volatile memory (EPROM, EEPROM or Flash memory). The load constituted by the memory array to be programmed or erasure is capacitive. In FIG. 2, this load is therefore symbolized by a capacitor 5 represented by dashes and connected between the output S of the circuit and the ground. This load is supplied with current but, since it is a capacitive load, it is indirectly the value and the shape of the voltage at its terminal that is controlled. For, the circuit according to the invention enables the automatic control of the voltage Vpp at output S so that this voltage has the form of a rising ramp whose slope remains below a critical value. According to one advantage of the invention, the asymptotic value of this slope, namely the maximum value reached by the voltage Vpp at the end of the ramp, is equal to the high voltage HIV delivered by the booster circuit 1. Indeed, the load transistor 2 has a source/drain voltage that is practically zero so that it introduces no voltage drop between the output of the booster circuit 1 and the output S of the high ramp voltage generation circuit.

The load transistor 2 is crossed by a load current. The voltage Vpp at the terminals of the capacitive load 5 is therefore a rising voltage. Without the feedback circuit for the control of the current in the load transistor according to the invention, this voltage would reach the level of the voltage HIV suddenly. In other words, the slope of the voltage Vpp would be very steep resulting in damage to the oxide layer of the floating-gate transistors that constitute the memory array. This is why the feedback circuit for the control of the current of the load transistor 2 carries out an automatic control of the slope of the ramp voltage Vpp available at the drain of this transistor.

To this end, this circuit has a means to convert the value of the slope of the high ramp voltage Vpp into a value of measurement current Ic. This means has a reference capacitor Cref, one terminal of which is connected to the drain of the transistor 2 while its other terminal is connected to the drain of an N type transistor 7 mounted as a diode, the source of which is connected to the ground. Since drain/source voltage of this diode-mounted transistor 7 is more or less constant, the voltage at the terminals of the reference capacitor Cref follows the high ramp voltage Vpp at the point S. When the voltage Vpp increases linearly (namely with a constant slope), the transistor Cref gets charged with a constant current Ic. This current constitutes a measurement current proportional to the slope of the high ramp voltage Vpp. The circuit also has means to measure the difference between this measurement current Ic and a reference current Iref having a specified and constant value. These measurement means comprise a difference amplifier that has a P type transistor 8 and an N type transistor 9 that are series-connected. The source of the P type transistor 8 is connected to a positive supply terminal at which a positive and constant direct voltage is available. This will preferably be the general supply voltage Vcc and not the high voltage HIV so as not to penalize the performance characteristics—in terms of output current available for the load—of the booster circuit 1 whose fan-out is limited. The drain of the P type transistor 8 is connected to a node A. The control gate of the transistor 8 receives a bias voltage IREFP delivered by a bias circuit 11. This bias circuit has a current source 13 delivering the reference current Iref, series-connected with a diode-mounted P type transistor 12, between the positive supply terminal Vcc and the ground. The control gate and the drain of the P type transistor 12 are connected to the control gate of the transistor 8 to send it the bias voltage IREFP. In this way, the P type transistors 8 and 12 work as a current mirror so that the current flowing between the positive supply terminal and the node A through the transistor 8 is proportional to the reference current Iref generated by the current source 13. It is known that the coefficient of proportionality depends on the ratio of the sizes of the transistors 8 and 12 constituting the current mirror, and is determined by the gate width of these transistors. In a possible embodiment, shown in the Figures, this coefficient is equal to unity, the transistors S and 12 being of the same size.

The difference amplifier furthermore comprises an N type transistor 9 whose drain is connected to the node A and whose source is connected to the ground. The control gate of the transistor 9 is connected to the control gate and to the drain of the diode-mounted transistor 7 so that these transistors work as a current mirror. In this way, the current flowing between the node A and the ground through the transistor 9 is proportional to the measurement current Ic flowing through the reference capacitor Cref. In the same way as was explained for the current mirror constituted by the transistors 8 and 12, it is assumed in FIG. 2 that the coefficient of proportionality between these currents is equal to unity, the transistors 7 and 9 being of the same size, so that the current flowing through the transistor 9 is equal to the measurement current Ic. Here below, we shall see how it is possible to modify these coefficients and the technical effect that this brings.

The voltage at the node A constituting the output node of the comparison means according to the invention is a function of the difference between the reference current Iref and the measurement current Ic.

The transistors 8 and 9 work as an amplifier of this difference.

The generation circuit according to the invention finally comprises means to control the load current flowing through the load transistor 2, as a function of the difference between the reference current Iref and the measurement current Ic. To this end, these means comprise an N type transistor 10 having its source connected to the ground, its control gate connected to the output node A of the means for measuring the difference between Iref and Ic, and its drain connected to the drain and source of a diode-mounted P type transistor 3. The source of this diode-mounted P type transistor 3 is furthermore connected to the output of the booster circuit 1 delivering the high voltage HIV. The control gate and the drain of the transistor 3 are connected to the control gate of the load transistor 2, so that these two transistors work as a current mirror. The load current flowing through the load transistor 2 is therefore proportional to the current flowing through the transistor 10, this transistor 10 being controlled by the voltage at the output node A of the means to measure the difference between Iref and Ic.

The feedback circuit works so as to cancel the difference between, firstly, the currents flowing between the positive supply terminal and the node A through the transistor 8 and, secondly, the current flowing between the node A and the ground through the transistor 9.

The following is the principle of operation of the circuit of FIG. 2: if the load 5 connected to the output S of the a high ramp voltage generation circuit according to the invention draws a strong load current (having a constant value for a specified programming or erasure operation), the voltage Vpp at the terminals of the load 5, which is the voltage Vpp at the drain of the load transistor 2, increases linearly with a constant slope. This slope is converted into a measurement current Ic by the capacitor Cref according to the formula:

$$Ic = Cref \times \frac{dVpp}{dt}.$$

This current Ic is a constant current if the capacitive load 5 is itself constant. This measurement current Ic is compared with the reference current Iref by the difference amplifier constituted by the transistors 8 and 9. If the measurement current Ic is greater (or smaller respectively) than the reference current Iref, namely if the slope of the voltage Vpp is steeper (or respectively less steep) than a critical slope specified by the value of the current Iref, the voltage at the node A diminishes (or increases respectively). The result is that the gate/source voltage of the N type transistor 10 diminishes (or increases respectively) and that the current flowing through it diminishes (or increases respectively) accordingly. Thus the load current flowing through the load transistor 2 is also diminished (or increased respectively) so that the slope of the ramp voltage Vpp at its drain diminishes (or increases respectively). It will have been understood that the feedback control circuit for the current of the load transistor 2 works so as to cancel the difference between the measurement current Ic and the measurement current Iref. The result of this is that the slope of the ramp voltage Vpp applied to the load 5 is kept equal to the critical value determined by the value of the current Iref. In practice, the feedback circuit is used essentially to keep the slope of the voltage Vpp below said critical value inasmuch as this slope naturally tends to be excessively high.

It will be noted that the transistor 10 works in saturation mode, namely that its drain current is determined by the voltage VGS between its gate and its source.

FIG. 3 shows a possible embodiment of a circuit for the generation of a high ramp voltage according to the invention. In this Figure, the same elements as in FIG. 2 bear the same references and shall not be described as such. The drawing of FIG. 3 is distinguished from that of FIG. 2 by the presence of certain additional test and/or control elements.

These elements are controlled by control signals generated by a control unit 100. Other functions of the circuit shall be explained by the presenting of additional components.

The N type transistor 10 is serially connected with the diode-mounted P type transistor 3 and with two other N type transistors, MB and MC respectively. The transistor MB whose source is connected to the ground and whose drain is connected to the source of the transistor 10 receives a bias signal IREFN at its control gate. The transistor MC whose source is connected to the drain of the transistor 10 and whose drain is connected to the drain and to the control gate of the transistor 3 receives a signal NNOP at its control gate. An N type transistor 71 is parallel-connected to the diode-mounted transistor 7. This transistor 71 is connected by its drain to the drain and control gate of the transistor 7 and by its source to the ground. At its control gate, it receives a control signal NOP which is complementary to the above-mentioned signal NNOP. When the signal NOP is in the logic 1 state, the diode-mounted transistor 7 is short-circuited so that the regulation is inactive. When it is in the logic 0 state, the regulation is active.

Two other P type transistors 2a and 2b are parallel-connected to the load transistor 2. This arrangement is designed so that sufficient load current is available. It will be noted that the gate width of the load transistors 2, 2a and 2b is ten times greater than that of the diode-mounted transistor 3. Thus, the load current is thirty times greater than the current imposed in the arm comprising the transistors 3, MC, 10 and MB.

Two P type transistors, respectively 8a, 8b, 8c, are parallel-connected with the transistor 8. Some of these transistors, at least 8b and 8c, have their source connected to the positive supply terminal (delivering the voltage Vcc) by means of a P type transistor 81 working as a switch controlled by the activation circuit 80. This circuit 80 comprises means (not shown) to compare the general supply voltage Vcc with a threshold and generate a logic signal taken to the control gate of the transistor 81 to turn it on when the voltage Vcc is below this threshold. In one preferred embodiment, the threshold is equal to 2.2 volts. The current flowing between the positive supply terminal Vpp and the node A is then increased so that the high ramp voltage Vpp can rise only with a slope that is less steep. Indeed, when the general supply voltage Vcc is below the 2.2 volt threshold, the load pump constituting the booster circuit 1 is not capable of providing a sufficient output current to charge the memory array with a slope as steep as when the general supply voltage Vcc is in the range of 3 to 5 volts. This is an appropriate range of operation for the load pump. This is why it is necessary to lessen the slope of the high ramp voltage Vpp. The programming or erasure will be done at lower speed, but it will be done all the same. If k transistors 8a, 8b, 8c, . . . should be parallel-connected to the transistor 8, then a current equal to (k+1)×Iref would flow between the positive supply terminal Vcc and the node A.

Other P type transistors 9a, 9b, 9c are also parallel-connected to the transistor 9. At least some of these transistors (and in FIG. 3 all these transistors) are connected by their source to the ground by means of N type transistors, 19a, 19b, 19c respectively, working as a switch. The source of these transistors 19a, 19b, 19c is connected to the ground and their drain is connected to the source of the transistors 9a, 9b, 9c. At their control gate, the transistors 19a, 19b, 19c receive one and the same signal SPEED generated by an acceleration circuit 19. When the logic signal SPEED is in the logic 1 state, the switches 19a, 19b, 19c are on. If these transistors are m in number, where m is an integer, then a current equal to (m+1)×Ic flows between the node A and the ground. The acceleration circuit 19 has means (not shown) to compare the high ramp voltage VPP with a threshold (equal for example to 10 volts). The signal SPEED is in the logic 1 state when the voltage Vpp is below the threshold. If not, it is in the logic 0 state. When the signal SPEED is in the logic 1 state, the high ramp voltage Vpp has a steeper slope. Indeed, so long as the value of this voltage is below 10 volts, the oxide layer of the floating-gate transistors constituting the memory array is not damaged and it is therefore possible to charge the memory array at higher speed. The high voltage Vpp then has a slope that is steeper than the critical slope without any risk of damage to this oxide layer.

More generally, the voltage at the node A is therefore a function f of the reference current Iref and of the measurement current Ic which is a linear combination of these currents which are assigned coefficients k+1 and m+1 respectively. The function of the feedback circuit for the control of the load current is to cancel the expression (k+1)×Iref−(m+1)×Ic. The circuit furthermore has a diode-mounted N type transistor MA whose drain and control gate are connected to the node A and whose source is connected to the ground through two series-connected N type transistors MD and ME respectively. The transistor MD whose drain is connected to the source of the transistor MA and whose source is connected to the drain of the transistor ME, receives the above-mentioned logic signal NOP at its control input. The transistor ME, whose source is connected to the ground, receives a logic signal HVON at its control gate. A capacitor C2 is furthermore connected between the node A and the ground. The role of these components shall be explained here below.

Furthermore, a capacitor C1 is connected between the output S of the circuit and the ground in order to limit the gain of the feedback loop for the low values of the load (for example for an operation to program a single bit of the memory).

The working of the circuit of FIG. 3 shall now be described with reference to the timing diagrams of FIGS. 4a to 4e. Initially, the signal NOP is in the logic 1 state and the signal HVON is in the logic 0 state.

The voltage Vpp initially has the same value as the general supply voltage Vcc.

When the signal HVON goes to the logic 1 state, the load pump constituting the booster circuit 1 begins to function. The voltage HIV delivered by its output 4 then increases until it reaches it nominal output value (FIG. 4b) which, in one example, is equal to 18 volts, the value of the general supply voltage Vcc being 3 volts.

Furthermore, the transistor ME then comes on. Since the transistor MD is initially on owing to the fact that the signal NOP is initially in the logic 1 state, a current can flow from the positive supply terminal Vcc through the transistors 8 and 8a (and, as the case may be, also through the other transistors 8b and 8c which are parallel-connected), and through the diode-mounted transistor MA and the transistors MD and ME. The voltage at the node A then rises to reach a value that is substantially equal to one volt (1 V) and the capacitor C2 gets charged at this value.

It will be noted that no current flows in the arm containing the transistor 10 inasmuch as the transistor MC is turned off by the signal NNOP at the logic 0 state. Furthermore, the transistor 71 is turned on by the signal NOP in the logic 1 state so that the feedback is not active (the current Ic flows entirely towards the ground through the transistor 71).

At the end of a period of time that is long enough for the high voltage HIV to have reached its nominal value (it then remains constant, apart from small drops in voltage due to possible peaks of current delivered into the load), the signal NOP goes from the logic 1 state to the logic 0 state (FIG. 4c). The transistor 71 then goes off. The feedback becomes active inasmuch as the current Ic henceforth flows through the diode-mounted transistor 7.

Similarly, the transistor MD is turned off so that current no longer flows across the arm containing the transistor MA.

Conversely, the transistor MC is turned on by the signal NNOP (which is complementary to the signal NOP) in the logic 1 state.

The circuit can then work according to the principle explained here above with reference to FIG. 2. The high voltage Vpp then rises linearly with a dVpp loss ___ limited to a threshold value whatever the $_{dt}$ value of the load, a load current being then delivered to the drains of the load transistors 2, 2a and 2b, constituting the output S of the current, to load the memory array.

So long as the high voltage Vpp is below the threshold of the acceleration circuit 19 (which is equal to 10 volts), the signal SPEED is in the logic 0 state (FIG. 4d). The switches 19a, 19b and 19c are off and only the transistor 9 is crossed by a current Ic. The slope of the voltage Vpp is then steep at the beginning as can be seen in FIG. 4e in which this slope is referenced 14a. This enables a faster charging of the memory array for the values of Vpp at which there is no risk of damage to the oxide layer 105 of the floating-gate transistors that constitute it.

By contrast, once the high voltage Vpp becomes greater than the threshold of the acceleration circuit 19, the signal SPEED goes to the logic 1 state (FIG. 4d). The k transistors that are parallel-connected to the P type transistor 9 (in this case the three transistors 9a, 9b, 9c) are on and each of them lets through a current equal to the measurement current Ic from the node A to the ground through the switches 19a, 19b and 19c respectively. It is therefore, in all, a current equal to k+1 times (in this case four times) the measurement current Ic that flows from the node A to the ground. The high voltage Vpp therefore rises with a slope, referenced 14b in FIG. 4e, that is less steep and, in any case, less steep than the critical slope. Indeed, the voltage at the node A is then "drawn" towards the ground by four transistors instead of only one.

As will have been understood, the greater the coefficient of proportionality between, firstly, the current flowing from the node A to the ground and, secondly, the measurement current Ic, the lower is the voltage at the node A, so that the load current is low and so that (for a load of constant value during a specified programming or erasure operation) the slope of the high voltage ramp Vpp is mild. Conversely, the greater the coefficient of proportionality between, firstly, the current flowing between the positive supply terminal Vcc and the node A and, secondly, the reference current Iref, the higher is the voltage at the node A so that the load current is high and the slope of the high ramp voltage Vpp (again for a capacitive load of constant value) is steep.

When the high ramp voltage Vpp reaches the maximum value of the ramp which (owing to the fact that the load transistor 2 is a P type transistor) is the voltage HIV delivered by the booster circuit, the slope of the voltage Vpp becomes zero (FIG. 4e). The circuit according to the invention nevertheless seeks to keep it in the region of the critical value. It is therefore to be feared that the load current will be increased substantially and that it will become impossible to supply it through the output 4 of the booster circuit 1 without disturbing the level of the high direct voltage HIV that it delivers. In order to prevent this, the transistor MB is biased by the voltage IREFN so that it limits the current flowing in the arm comprising the transistors 3, MC, 10 and MB. Thus, the load current can be limited to a few microamperes (mA).

The working of the circuit of the invention is interrupted when the signal NOP goes back to the logic 1 state. The signal HVON then goes to the logic 0 state to interrupt the consumption of current between the node A and the ground through the transistor MA.

Finally, it will be noted that the capacitor C2 also has a dynamic role and limits the gain of the control loop for the high frequencies.

What is claimed is:

1. A generation circuit for generating a high ramp voltage (Vpp) for the supply of voltage to a capacitive load, comprising floating-gate transistors as storage elements, said generation circuit comprising:

a voltage booster circuit comprising an output for providing a high direct voltage (HIV) of constant value; and a P type load transistor comprising a source, which is coupled to the output of the voltage booster circuit, a control gate, which is coupled to a control feedback circuit to control a load current, and a drain, which is coupled to the capacitive load, the high ramp voltage (Vpp) being available at the drain, wherein the control feedback circuit to control the load current includes:

means for converting the value of the slope of the high ramp voltage (Vpp) into a value of a measurement current (Ic);

means for measuring the difference between the measurement current (Ic) and a reference current (Iref) having a constant specified value; and means for controlling the load current flowing through the P type load transistor as a function of said difference.

2. The circuit of claim 1, wherein the means for converting comprises a reference capacitor with a constant specified value.

3. The circuit of claim 2, wherein the means for measuring the difference between the measurement current (Ic) and the reference current (Iref) include a difference amplifier comprising:

at least one first P type transistor connected by its source to a positive supply voltage (Vcc) and by its drain to an output node, and receiving a bias voltage (IREFP) at its control gate such that the current flowing between the positive supply (Vcc) terminal and the output node is proportional to the reference current (Iref);

at least one first N type transistor connected by its source to the ground and by its drain to the output node, and receiving a bias voltage at its control gate such that the current flowing between the output node and the ground is proportional to the measurement current (Ic).

4. The circuit of claim 3, wherein the means for measuring the difference between the measurement current (Ic) and the reference current (Iref) include k other P type transistors parallel-connected to the first P type transistor, where k is an integer, the source of at least some of the k other transistors being connected to the positive supply terminal (Vcc) through a switch whose ON state is activated by an activation circuit when the value of said supply voltage is below a specified threshold in order to increase the coefficient of proportionality between, firstly, the current flowing from the positive supply (Vcc) terminal to the output node and, secondly, the reference current (Iref).

5. The circuit of claim 4, wherein the means for measuring the difference between the measurement current (Ic) and the reference current (Iref) include m other N type transistors parallel-connected to said first N type transistor, where m is an integer, the source of at least some of these m other transistors being connected to the ground through m switches respectively, whose ON state is activated by an acceleration circuit when the value of the high ramp voltage is above a specified threshold in order to increase the coefficient of proportionality between, firstly, the current flowing from the output node to the ground and, secondly, the measurement current (Ic).

6. The circuit of claim 3, wherein a first terminal of the reference capacitor is connected to the drain of the load transistor and wherein its second terminal is connected to the drain of a diode-mounted N type transistor whose source is connected to the ground and whose control gate is connected to the control gate of the N type transistor of the difference amplifier to transmit its bias voltage to it so that the two transistors work as a current mirror.

7. The circuit of claim 3, wherein the means to control the load current flowing through the load transistor comprise an N type transistor having its control gate connected to the output node of the means to measure the difference between the measurement current (Ic) and the reference current (Iref), its source connected to the ground and its drain connected to a diode-mounted P type transistor that is connected by its source to the high supply voltage (HIV) and by its drain and its control gate to the control gate of the load transistor, so that these transistors work as a current mirror.

* * * * *